(12) United States Patent
Tsai et al.

(10) Patent No.: US 7,045,755 B2
(45) Date of Patent: May 16, 2006

(54) IMAGE SENSOR PACKAGE AND SYSTEM

(75) Inventors: Ming-Chiang Tsai, Tu-Chen (TW); Chun-Yu Lee, Tu-chen (TW); Tsung-Wei Jiang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 9 days.

(21) Appl. No.: 10/879,545

(22) Filed: Jun. 28, 2004

(65) Prior Publication Data

US 2004/0262496 A1    Dec. 30, 2004

(30) Foreign Application Priority Data

Jun. 27, 2003   (TW) ............................... 92117591 A

(51) Int. Cl.
*H01L 27/00* (2006.01)
*H01L 31/203* (2006.01)

(52) U.S. Cl. ................ 250/208.1; 250/216; 250/239; 257/432; 257/433

(58) Field of Classification Search ............ 250/208.1, 250/216, 239; 257/432–433, 680, 787; 359/507–514
See application file for complete search history.

(56) References Cited

U.S. PATENT DOCUMENTS

| 5,821,532 | A | * | 10/1998 | Beaman et al. ............. 250/239 |
| 6,396,043 | B1 | | 5/2002 | Glenn et al. |
| 6,455,774 | B1 | | 9/2002 | Webster |
| 6,483,101 | B1 | * | 11/2002 | Webster ...................... 250/216 |
| 6,518,656 | B1 | * | 2/2003 | Nakayama et al. ......... 257/680 |
| 6,545,332 | B1 | * | 4/2003 | Huang ........................ 257/433 |
| 6,734,419 | B1 | * | 5/2004 | Glenn et al. ................ 250/239 |
| 6,774,447 | B1 | * | 8/2004 | Kondo et al. ............... 257/432 |
| 6,849,915 | B1 | * | 2/2005 | Tsai ........................... 257/432 |
| 2003/0066955 | A1 | * | 4/2003 | Schaub et al. ............. 250/239 |
| 2004/0212078 | A1 | * | 10/2004 | Lee et al. ................... 257/703 |
| 2005/0099532 | A1 | * | 5/2005 | Tseng ........................ 348/374 |
| 2005/0127281 | A1 | * | 6/2005 | Zheng et al. ............... 250/239 |

FOREIGN PATENT DOCUMENTS

JP            62018737 A   *   1/1987

\* cited by examiner

*Primary Examiner*—Stephone B. Allen
*Assistant Examiner*—Davienne Monbleau
(74) *Attorney, Agent, or Firm*—Wei Te Chung

(57) ABSTRACT

An image sensor package (10) includes a housing (34) defining a top opening, an image sensor (14) received in the housing, and a converging lens (36) covering the opening to hermetically seal the housing and form a window for light to pass through into the housing. The image sensor has an active area which faces the converging lens and which is responsive to light. The converging lens not only provides hermetic sealing for the housing, but also converges light before the light strikes the active area of the image sensor. Accordingly, a focal length F is reduced, and a size of the image sensor package and the image sensor system can be reduced.

1 Claim, 1 Drawing Sheet

IMAGE SENSOR PACKAGE AND SYSTEM

BACKGROUND OF THE INVENTION

1. Field of the Invention

The present invention relates generally to packaging of opto-electronic components, and more particularly to packaging of an image sensor.

2. Description of Related Art

Image sensors and image sensor assemblies are best known as components in modern consumer goods such as hand-held cameras. In these assemblies, an image sensor is mounted inside a housing, with the housing providing support for a window. Visible light passes through the window and strikes the image sensor.

In assembly, an underside of the image sensor is mounted to a printed circuit board. Then the housing is mounted to the printed circuit board around the image sensor. The housing not only provides a hermetic barrier around the image sensor, but also a top opening above the image sensor for installation of the window thereat.

The image sensor is highly sensitive to dust, contamination, moisture and other environmental factors. The image sensor has an active area which is responsive to light. Even the slightest blemish on the active area is liable to distort or obstruct light passing therethrough, resulting in defective operation or failure of the image sensor assembly. Thus the provision of a hermetic space for the image sensor is critical.

In a conventional image sensor assembly, the opening of the housing above the image sensor is hermetically sealed with plate glass to provide the window and the hermetic space containing the image sensor. The window allows light to pass therethrough into the housing.

As the art of opto-electronics progresses toward smaller lightweight electronic devices, it is becoming increasingly important that the size of image sensor assemblies used in these electronic devices is correspondingly small. A device such as a camera employs an optical lens that focuses visible light into the image sensor package. The optical lens has a focal length F, which limits how close the optical lens can be placed in relation to the image sensor. This necessarily makes the camera rather bulky.

SUMMARY OF THE INVENTION

Accordingly, an object of the present invention is to provide an image sensor package having a reduced size.

Another object of the present invention is to provide an image sensor system having a reduced size.

To achieve the first above-mentioned object, an image sensor package in accordance with the present invention includes a housing defining a top opening, an image sensor received in the housing, and a converging lens covering the top opening to hermetically seal the housing and form a window for light to pass through into the housing. The image sensor has an active area which faces the converging lens and which is responsive to light.

To achieve the second above-mentioned object, an image sensor system includes a housing defining a top opening, an image sensor received in the housing, and a lens system comprising at least an output lens. The output lens covers the opening to hermetically seal the housing and form a window for light to pass through into the housing. The image sensor has an active area which faces the converging lens and which is responsive to light.

The converging lens not only provides hermetic sealing for the housing, but also converges light before the light strikes the active area of the image sensor. Accordingly, a focal length F is reduced, and a size of the image sensor package and the image sensor system can be reduced.

In the case of the image sensor system, the output lens not only functions as an essential element of the lens system, but also provides hermetic sealing for the housing.

Other objects, advantages and novel features of the present invention will become more apparent from the following detailed description and claims, and from the accompanying drawings, in which:

DETAILED DESCRIPTION OF PREFERRED EMBODIMENTS OF THE INVENTION

Reference will now be made to the drawings to describe the present invention in detail.

Figure 1:
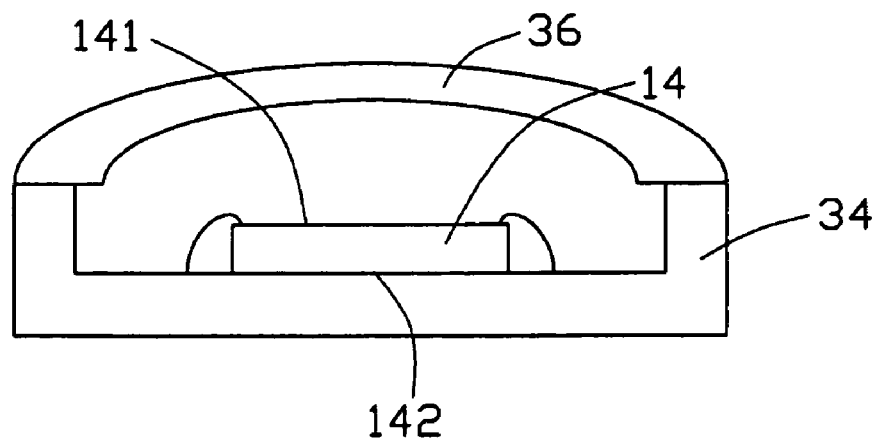
FIG. 1 is a schematic side elevation, isometric view of a an image sensor package in accordance with the present invention.

Referring to FIG. 1, an image sensor package 10 in accordance with the present invention includes a housing 34 defining a top opening (not labeled), an image sensor 14 mounted in the housing 34, and a converging lens 36 covering the opening. The image sensor 14 has an active area 141 which faces the converging lens 36 and which is responsive to light. The image sensor 14 also has a bottom face 142. The converging lens 36 hermetically seals the housing 34, and forms a window for external light to pass through into the housing 34. A height of a space inside the housing 34 is greater than a thickness of the image sensor. A distance is defined between the active area 141 of the image sensor 14 and a bottom surface (not labeled) of the converging lens 36.

The converging lens 36 hermetically seals the housing 34 using conventional techniques well known to those of skill in the art. Accordingly, the image sensor 14 is protected from damage or destruction by ambient dust, contamination or moisture.

In use, light passes through the converging lens 36 and strikes the active area 141 of the image sensor 14. The image sensor 14 responds to the light as is well known to those of skill in the art.

The image sensor package 10 can typically be employed in an apparatus such as a camera which has an optical lens that focuses visible light into the image sensor package 10. The optical lens of itself has a focal length F, which limits how close the optical lens can be placed in relation to an image sensor. This in turn limits the extent to which the camera can be miniaturized. By employing the converging lens 36, the focal length F is reduced. In practical terms, this means that the distance from the active area 141 of the image sensor 14 to the bottom surface of converging lens 36 can be reduced. As a result, an overall height of the image sensor package 10 is reduced, in comparison with prior art image sensor packages. Thus the image sensor package 10 is well suited for use with miniature lightweight electronic devices such as cell phones that incorporate a camera.

Figure 2:
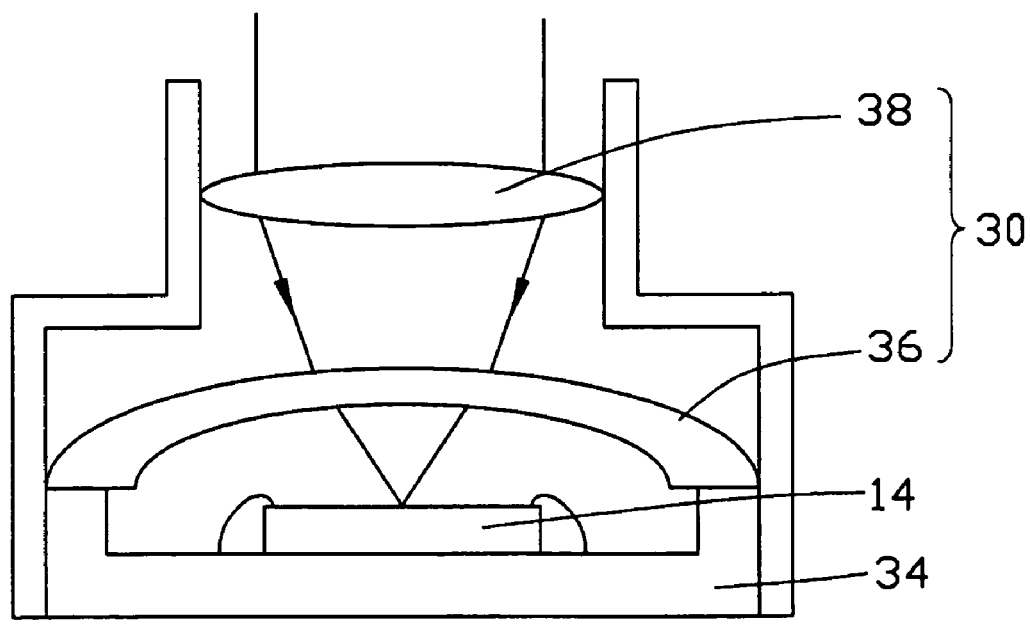
FIG. 2 is a schematic side elevation, isometric view of an image sensor system in accordance with the present invention.

Referring to FIG. 2, an image sensor system 20 includes a housing 34 defining a top opening (not labeled), an image sensor 14 received in the housing 34, and a lens system 30. The image sensor 14 has an active area 141 facing the opening, and a bottom face 142. The active area 141 is responsive to light. The lens system 30 comprises an input lens 38 receiving light from an object (not shown), and an output lens 36 emitting light received from the input lens 38. The output lens 36 is a converging lens, which hermetically seals the housing 34 and forms a window for the received light to pass through into the housing 34.

In the image sensor system 20, the converging lens 36 not only functions as an essential element of the lens system 30, but also provides both the hermetical sealing for the housing 34 and the window.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An image sensor system comprising:

a housing having a housing opening;

an image sensor received in the housing, the image sensor having an active area which faces the opening and which is responsive to light; and a lens system comprising at least a first lens and a second lens, the first lens being mounted in the housing proximate the housing opening, the second lens being a converging lens disposed between the first lens and the active area of the image sensor, the second lens being configured for hermetically sealing the image sensor within the housing.

* * * * *